US 6,541,349 B2

(12) United States Patent
Arthanari et al.

(10) Patent No.: US 6,541,349 B2
(45) Date of Patent: Apr. 1, 2003

(54) SHALLOW TRENCH ISOLATION USING NON-CONFORMAL DIELECTRIC AND PLANARIZATRION

(75) Inventors: Senthilkumar Arthanari, San Jose, CA (US); Shaw-Ning Mei, Poughkeepsie, NY (US); Edward J. Vishnesky, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/764,674

(22) Filed: Jan. 18, 2001

(65) Prior Publication Data

US 2002/0094649 A1 Jul. 18, 2002

(51) Int. Cl.[7] .............................................. H01L 21/76
(52) U.S. Cl. ....................................... 438/424; 438/427
(58) Field of Search ................................. 438/424, 427

(56) References Cited

U.S. PATENT DOCUMENTS

| | | | |
|---|---|---|---|
| 5,298,450 A | 3/1994 | Verret .......................... 438/67 |
| 5,316,965 A | 5/1994 | Philipossian et al. ......... 438/70 |
| 5,646,063 A | 7/1997 | Mehta et al. ................. 438/67 |
| 5,702,976 A | 12/1997 | Schuegraf et al. ............ 438/67 |
| 5,719,085 A | 2/1998 | Moon et al. ................. 438/424 |
| 5,721,173 A | 2/1998 | Yano et al. .................. 438/424 |
| 5,728,621 A | * 3/1998 | Zheng et al. ................ 438/221 |
| 5,729,043 A | 3/1998 | Shepard ....................... 257/519 |
| 5,741,740 A | 4/1998 | Jang et al. ................... 438/435 |
| 6,033,981 A | 3/2000 | Lee et al. .................... 438/624 |
| 6,048,771 A | 4/2000 | Lin et al. .................... 438/296 |
| 6,048,775 A | 4/2000 | Yao et al. .................... 438/427 |
| 6,057,207 A | 5/2000 | Lin et al. .................... 438/424 |
| 6,071,792 A | 6/2000 | Kim et al. ................... 438/424 |
| 6,133,114 A | 10/2000 | Lu et al. ...................... 438/424 |
| 6,159,822 A | 12/2000 | Yang et al. .................. 438/427 |
| 6,218,266 B1 | * 4/2001 | Sato et al. ................... 438/424 |

OTHER PUBLICATIONS

"Semiconductor Lithography Principles, Practices, and Materials", Wayne M. Moreau, Microdevices Physics and Fabrication Technologies, 1998 Plenum Press, New York, pp. 722–729.

"High–density plasma CVD and CMP for 0.25–μm intermetal dielectric processing", J.T. Pye, H.W. Fry, W.J. Schaffer, Watkins–Johnson Co., Scotts Valley, CA, Dec. 1995 Solid State Technology, pp. 65–71.

* cited by examiner

Primary Examiner—Olik Chaudhuri
Assistant Examiner—William M. Brewster
(74) Attorney, Agent, or Firm—William D. Sabo

(57) ABSTRACT

A method is provided for planarizing a structure such as a shallow trench isolation region on a semiconductor substrate. A semiconductor substrate is provided having raised and lowered regions with substantially vertical and horizontal surfaces. The lowered regions may correspond to trench regions. The upper regions are covered by a masking layer of nitride having a predetermined thickness. Filler material such as non-conformal high density plasma oxide may be deposited over the horizontal surfaces to a thickness terminating within that of the thickness of the nitride layer. The raised regions of the filler material are then selectively removed in a single planarizing step without removing the filler material in the lowered regions using a fixed abrasive hard polishing pad, as opposed to an abrasive slurry.

10 Claims, 2 Drawing Sheets

SHALLOW TRENCH ISOLATION USING NON-CONFORMAL DIELECTRIC AND PLANARIZATRION

BACKGROUND OF THE INVENTION

1. Field of the Invention

The present invention generally relates to a process to form planarized shallow trench isolation (STI) methods and structures using a non-conformal filler of insulator, preferably a high density plasma (HDP) oxide.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers of interconnect which are separated by dielectric layers.

As integrated circuit device technology has advanced and integrated circuit device dimensions have decreased, it has become increasingly common within advanced integrated circuits to employ trench isolation methods such as shallow trench isolation (STI) methods to form isolation regions nominally co-planar with adjoining active semiconductor regions of semiconductor substrates. Such trench isolation methods typically employ the formation of an conformal oxide or insulator layer which is thereafter planarized by dry etching or chemical mechanical polish (CMP) planarizing methods to provide a nominally planarized surface to a trench isolation region formed from a trench fill dielectric layer formed within the trench. Such STI regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure.

Two major challenges in achieving the shallow trench isolation (STI) structure are: (1) filling the narrow trenches without voids or seams defect, and (2) planarization of trenches of diverse widths. Conventional STI processes which employ conformal low pressure chemical vapor deposition (LPCVD) TEOS deposition and complicated planarization processes with multi-step photo-resist coating, reactive ion etch (RIE) etch back and chemical mechanical polish (CMP) are expensive to implement due to the multitude of process steps required. Due to the nature of conformal deposition techniques such as LPCVD TEOS, seams are virtually always present shallow trench isolation regions due to the gradual closing of the lateral trench surfaces. The seams become a major problem as the device dimensions scale downward and the aspect ratio of the STI increases.

Others problems are those found in most insulator planarization processes which are caused by the inability to control the insulator removal rate within trenches. This phenenona is known as dishing.

An advantage of non-conformal deposition processes such as high density plasma deposition (HDP) of oxide is than deposited layers do not have the seam found in conformal deposition methods. A problem with HDP is that highly chemical reactive reagents cannot be used to chemically remove the excess oxide due to the significant thickness variations present in the deposited films.

SUMMARY OF THE INVENTION

In view of the foregoing and other problems of the conventional methods, it is, therefore, an object of the present invention to provide a method for forming STI in a simple and efficient manner. The method includes the providing of a semiconductor substrate having raised and lowered regions with substantially vertical and horizontal surfaces. The vertical surfaces may have a predetermined height. Further, the method includes depositing non-conformal filler material over the horizontal surfaces to at least a thickness slightly thicker than the predetermined height so as to provide raised and lowered regions of the filler material. Thereafter, the raised regions are selective removed without intervening process steps. The preferred method of removal is by Chemical-Mechanical-Planarization.

The filler material is preferred to be non-conformal high density plasma (HDP) oxide. Neither the raised or lower regions are required to be protected by any masking layers.

An oxide pad and a nitride pad is provided on the surface of the semiconductor substrate as is conventional for the formation of the shallow trenches into which the filler material will be formed. The raised and lowered regions are formed by masking regions of the nitride pad and etching exposed areas of the nitride pad. The oxide pad and the nitride pad are removed after the CMP of the raised filler material. By providing a CMP technology which uses hard, inflexible polishing pads, the pads are not deflected into the areas of extensive filler material and it is subsequently not removed. That is, the remaining STI filler material is not subject to dishing.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENT OF THE INVENTION

Figure 1:
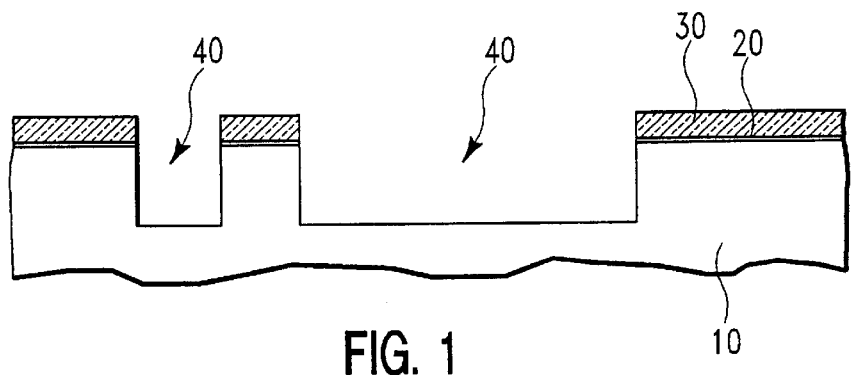
FIGS. 1–4 show cross section views of the semiconductor substrate of the invention during the several steps according to the present invention.
Figure 2:
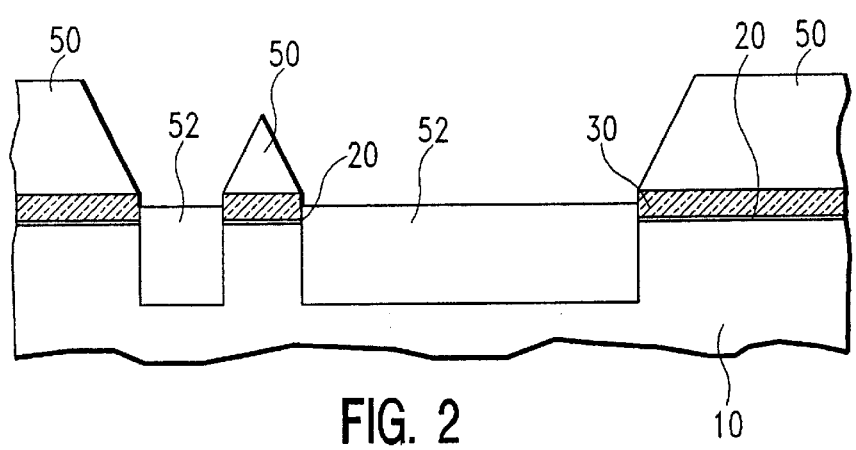
Figure 3:
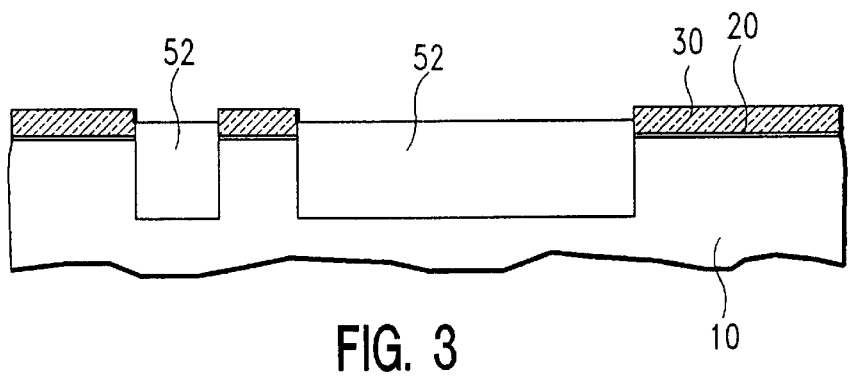

Referring to FIG. 1, there is shown a semiconductor substrate 10, preferably silicon or silicon doped with germanium, is initially provided and an oxide pad 20 and a nitride pad 30 are then formed over silicon substrate 10. Following conventional photoprocessing steps the oxide/nitride pads 20 and 30 are patterned and etched to expose substrate 10 where isolation regions are to be formed. Trench regions 40 are then formed into the silicon substrate 10 in a conventional manner. Normally, the trench region 20 are etched a desired depth using an anisotropic subtractive etch process. Conventional and appropriate subtractive etch methods include reactive ion etching, which is also known as plasma etching or dry etching. Such an etch process normally exhibits high uniformity, high selectivity to the photoresist or other masking material, and high directionality (anisotropy), thus, rendering the depth of the trenches substantially uniform across a large substrate, such as a 200 or 300 mm diameter silicon wafer.

A filler material preferably formed of non-conformal high density plasma oxide 50 is provided over the entire silicon substrate and in the trench region 20 using a conventional deposition process. Pure silicon dioxide is preferably used, although doped oxides containing small amounts of phosphorous or boron may also be used. Further, fluorine may be useful for lowering the dielectric constant of the isolation. In general, any material which can be made in the form shown in the figures and is also useful as a trench isolation material can be used. The preferred material properties include good gap-fill, low dielectric constant, high purity, and thermal and chemical stability in the presence of other semiconductor device materials. As shown in FIG. 1, the oxide material 52 filling the trench should be very uniform and slightly thicker than the depth of the trench region 20, terminating in the pad nitride layer 30. The filler material 50 on the upper surfaces of the pad nitride 30, should also be of substantially uniform thickness, and preferably on the order of the thickness of the nitride film 40 or thinner, as determined by the deposition process. The thickness within the trenches 40 is, however, the nominal thickness to be obtained, as the upper portions of filler 50 will be subsequently be removed. The invention can accommodate some variation in the thickness and sidewall-profile or slope of the non-trench oxide material 50.

In a manufacturing environment, the thickness of the nitride pad 30 may have to be adjusted to allow deposition over the entire substrate to have its thickness terminate within the nitride layer due to capability of the combination of the trench etching process and the filler deposition process to provide across wafer thickness uniformity.

Unlike conventional methods, the non-conformal dielectric material, such as the high density plasma oxide, fills the trench region 20 without any seams defect. That is, HDP oxides can be made to have excellent gap-fill characteristics because the extra energy available in a high-density plasma system allows the balance in the competition between etching and deposition to be finely adjusted. In practice, a balance is struck that allows deposition to occur much more effectively on horizontal surfaces than on vertical ones. For example, argon bombardment knocks off the oxide formed on vertical surfaces and redeposits it on horizontal surfaces in the trench region 20. This sputter/deposition method achieves a non-conformal seams-free trench fill. For HDP oxide, this same balance between etching and deposition leads to the other features of the trench fill that are important to the invention.

The oxide 50 fills the trench region 20 to a predetermined height, which will be maintained throughout the entire planarization process. This predetermined height is preferably greater than a depth of the trench region 20 as measured from the bottom of the trench region 20 to the center of the pad nitride 30. As is known in the art, if the trench structure were made entirely of oxide and that oxide were bombarded with high-energy ions as are present in a physical- sputtering tool (or in a high-density plasma deposition tool) then the exposed corners of oxide would quickly become beveled, generally at a 45-degree angle. This occurs because the atoms on the exposed corner are the easiest to dislodge. Under the right circumstances, the oxide that gets knocked off the exposed corners can collect in the interior corners at the bottom of small trenches. These things all occur at once in a typical HDP oxide deposition process. That is, oxide material tends to deposit everywhere uniformly, but is preferentially knocked off the sides of existing vertical surfaces in the substrate (allowing for excellent gap-fill) and off of the growing shoulder at the upper edge of these surfaces to form the sloped beveled edges in the raised portion of the oxide.

Following the deposition of the filler material the coated substrate is subject to chemical-mechanical-planarization in which a very had polishing pad containing a fixed abrasive is used to planarize the substrate. The slurry should also contain an insignificant volume of any chemical reagent which would independently cause etching of the deposited filler material 52. The objective of the planarization process is to avoid abrasive contact with the filler material 52 while substantially removing all of the raised portions of filler material 50 to the exclusion of the material 52 deposited in the trenches and to stop on the pad nitride.

The use of a hard polishing pad is necessary in order to prevent the pad from deflecting over the regions where the trenches are formed in order not to cause dishing of the filler material 52 in the trenches.

Figure 4:
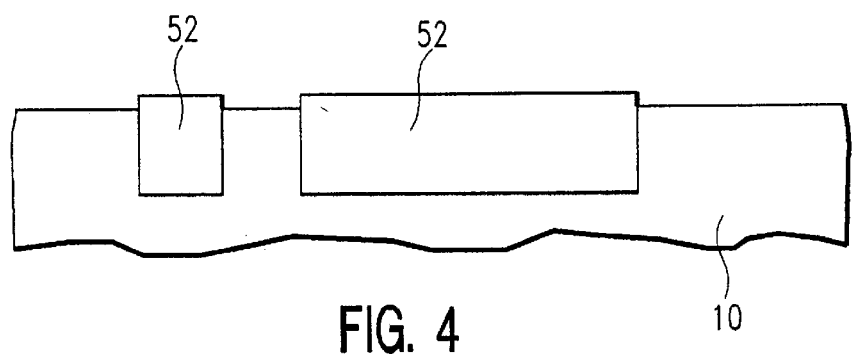

Once the isolation trenches have been formed, filled and planarized, the pad nitride 30 is preferably removed to allow for the shallow implantation of trace dopants to effect the desired electrical behavior in the subsequent semiconductor devices. After implantation, the pad oxide 20 is also normally removed and a very thin, very high-purity oxide is grown on the exposed surface portions of the silicon substrate 10. This thin oxide becomes the "transfer gate oxide" that covers the "channel region" of the semiconductor "switches" if MOSFETs are to be formed in the silicon substrate. FIG. 4 shows the resulting STI structure formed using the non-conformal high density plasma oxide. As discussed above, the resulting STI 52 is seamless due to the non-conformal HDP oxide.

The STI regions 52 are raised slightly above the surface of the remaining portions of the substrate as is desired in many semiconductor manufacturing processes.

Figure 5:
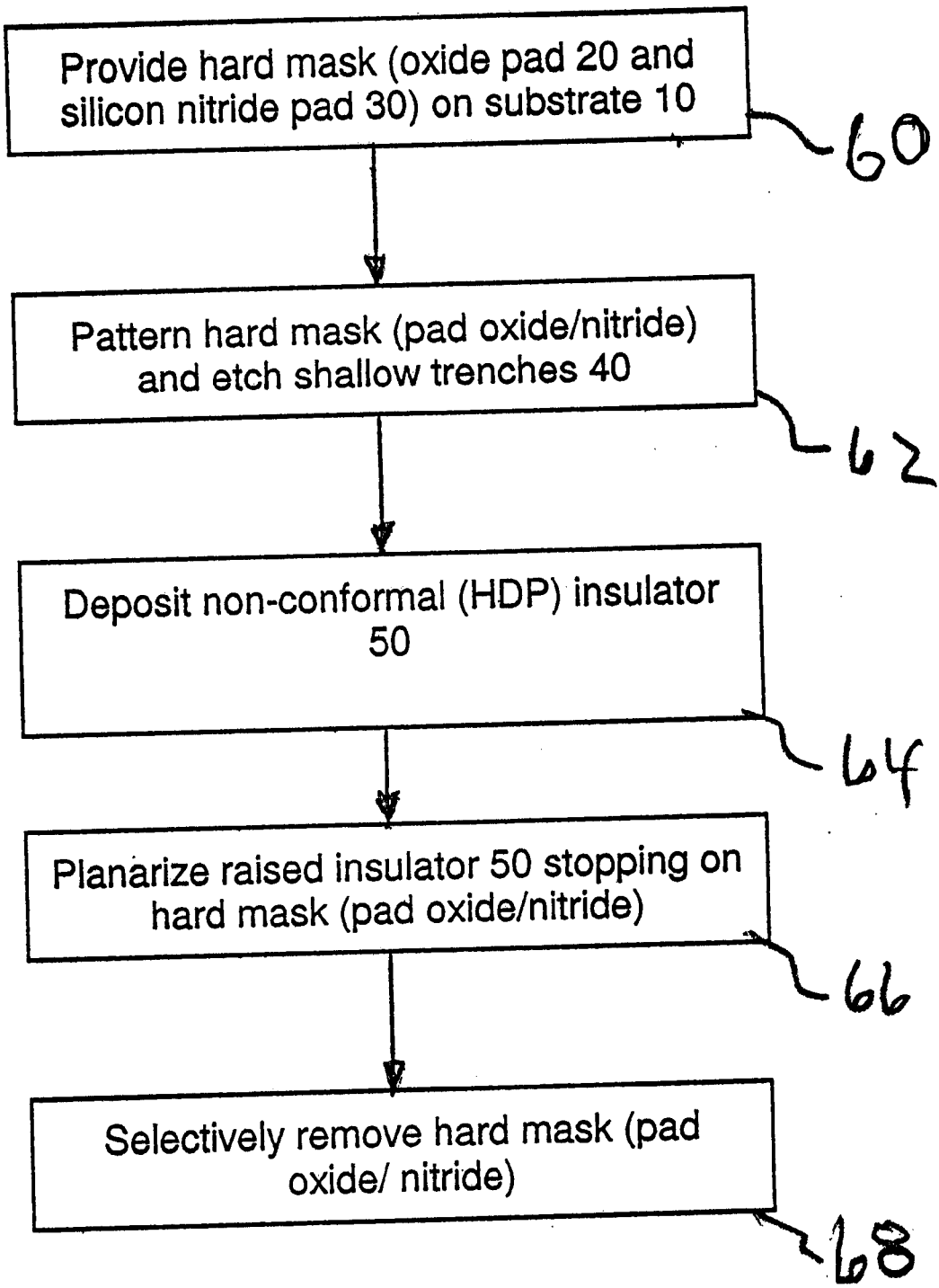
FIG. 5 shows a flow chart showing the critical steps of the STI process including the planarization process of the instant invention.

FIG. 5 shows a flowchart of the method according to the present invention for forming the STI using the non-conformal high density plasma. In step 60, the oxide pad and nitride pad 30 are provided on the semiconductor substrate 10. The nitride/oxide pads are then patterned and the trench regions 40 are then formed in step 62. The non-conformal high density plasma oxide. 50/52 is deposited over the entire semiconductor substrate 10 including the trench region 40 and the non-trench regions in step 64. The deposited trench-fill material is planarized in step 66. Subsequently, in step 68, the nitride pad 30 and oxide pad 20 are removed resulting in the planarized STI.

This invention results in a novel, yet very simple process to form a planarized STI structure using non-conformal high density plasma (HDP) oxide deposition and single step planarization process. This has at least three major advantages as compared with conventional STI processes. First, this invention eliminates many process steps employed by the current STI process such as photo resist planarization, reactive ion etching (RIE), etch back and CMP. Second, a non-conformal dielectric material such as high density plasma (HDP) oxide fills the trenches without any seams defect. All RIE and CMP related defects such as particulate contamination, CMP scratches and chatter markers may be eliminated using the present invention. Third, the present invention achieves uniform local and global planarization without adding any constraints to RX mask layout.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of planarizing a structure on a semiconductor substrate, the method comprising:

providing said semiconductor substrate with raised and lowered regions with substantially vertical and horizontal surfaces, said vertical surfaces having a predetermined height said substrate having a patterned masking layer of a predetermined thickness on raised regions;

non-conformally depositing filler material over said horizontal surfaces to a thickness terminating within the predetermined thickness of said masking layer so as to provide separate raised and lowered regions of filler material; and selectively removing said raised regions of said filler material without intervening masking, etch back of said masking layer or deposition of layers of any material on said substrate.

2. The method of claim 1, wherein said filler material comprises non-conformal high density plasma oxide.

3. The method of claim 1, further comprising providing an oxide pad on said semiconductor substrate and providing a nitride pad as said masking layer on said oxide pad, wherein said raised and lowered regions are formed by masking regions of the nitride pad and etching exposed areas of said nitride pad.

4. The method of claim 3, further comprising removing said oxide pad and said nitride pad after selectively removing said raised regions of said filler material.

5. The method of claim 1, wherein the selectively removing comprises a chemical-mechanical-planarization process which removes only said raised regions of said filler material without etching said lowered regions of said filler material.

6. A method for planarizing a trench region provided in a semiconductor substrate, the method comprising:

providing the semiconductor substrate with at least one trench region, said substrate having a patterned masking layer of a predetermined thickness thereon;

non-conformally applying a filler material to a thickness terminating within the predetermined thickness of said masking layer so as to provide separate regions of filler material in the trench region and over the semiconductor substrate; and removing only said filler material which is not provided in said trench region in a single processing step, and without intervening etch-back of said masking layer.

7. The method of claim 6, wherein said filler material comprises non-conformal high density plasma oxide.

8. The method of claim 6, wherein the removing comprises a single planarization step.

9. The method of claim 6, further comprising providing an oxide pad on said semiconductor substrate and providing a nitride pad on said oxide pad, wherein said at least one trench region is formed by masking regions of said nitride pad and etching exposed areas of said nitride pad.

10. The method of claim 6, further comprising removing said oxide pad and said nitride pad after removing the filler material which is not provided in the trench region, wherein adjacent sections of said trench regions and non-trench regions of filler material are separated by at least a gap of exposed underlying material.

* * * * *